(12) United States Patent
Britz

(10) Patent No.: US 8,582,265 B2
(45) Date of Patent: Nov. 12, 2013

(54) PROTECTION CIRCUIT AND METHOD FOR ELECTRONIC DEVICES

(75) Inventor: William John Britz, Kirkland, WA (US)

(73) Assignee: Fluke Corporation, Everett, WA (US)

( * ) Notice: Subject to any disclaimer, the term of this patent is extended or adjusted under 35 U.S.C. 154(b) by 296 days.

(21) Appl. No.: 12/788,025

(22) Filed: May 26, 2010

(65) Prior Publication Data

US 2011/0292556 A1   Dec. 1, 2011

(51) Int. Cl.
*H02H 3/20* (2006.01)

(52) U.S. Cl.
USPC .......................................... 361/91.5; 361/91.1

(58) Field of Classification Search
None
See application file for complete search history.

(56) References Cited

U.S. PATENT DOCUMENTS

| | | | | |
|---|---|---|---|---|
| 3,708,672 | A * | 1/1973 | Marinkovic | 361/176 |
| 4,158,150 | A * | 6/1979 | Dever | 307/117 |
| 5,457,591 | A | 10/1995 | Mock | |
| 6,519,127 | B1 * | 2/2003 | Check | 361/100 |
| 7,816,899 | B2 * | 10/2010 | Iwamura | 323/282 |
| 7,852,607 | B2 * | 12/2010 | Radosavljevic et al. | 361/42 |
| 2006/0007622 | A1 * | 1/2006 | Furukawa et al. | 361/115 |

FOREIGN PATENT DOCUMENTS

DE    298 23 936 U1    1/2000

OTHER PUBLICATIONS

Notification of the First Office Action, dated Jun. 27, 2013, in Chinese Patent Application No. 201110147931.0, filed May 25, 2011, 8 pages.

* cited by examiner

*Primary Examiner* — Rexford Barnie
*Assistant Examiner* — Angela Brooks
(74) *Attorney, Agent, or Firm* — Christensen O'Connor Johnson Kindness PLLC

(57) ABSTRACT

A circuit for protecting an electronic device from excessive voltages applied to an input or output terminal includes a solid state relay coupling the electronic device to the terminal. The solid state relay may include an opto-transistor coupled between the electronic device and the terminal and a light-emitting diode optically coupled to the opto-transistor. The solid state relay is coupled in series with a current limiting device, such as one or more enhancement mode field effect transistors, and an electromechanical relay. A voltage detector coupled to the terminal detects a voltage larger than a specific value and causes current to flow thorough the light-emitting diode, thereby interrupting the coupling between the terminal and the electronic device. The voltage detector may be coupled between two spaced-apart connections to the coupling path between the terminal to the electronic device so that the voltage detector avoids diverting current from the coupling path.

20 Claims, 2 Drawing Sheets

PROTECTION CIRCUIT AND METHOD FOR ELECTRONIC DEVICES

BACKGROUND

Electronic devices often have input terminals that receive signals of various types or output terminals from which output signals of various types are provided. In fact, many electronic devices have both such input terminals and output terminals. Such electronic devices include internal circuitry or components that may be damaged if a voltage having a large magnitude is applied to an input terminal or an output terminal. For example, electronic test equipment may have output terminals from which precision output voltages or currents are provided. The magnitude of these output voltages or currents may be relatively low, and the circuits or components that provide these output voltages or currents may be damaged if a relatively large voltage or current, such as an AC supply voltage, is applied to the output terminals.

It may seem to be a relatively simple matter to protect these circuits or components using, for example, a low current fuse. However, the circuits or components coupled to the terminals may be damaged before a fuse could reach melting temperature. Also, the impedance between the terminals may be too high to allow enough current to flow through the fuse responsive to a high voltage, so that the fuse would not open to protect the internal circuit or component. Fast-acting current sensing components might also be placed in parallel with the terminals. However, it may be important for all of the current supplied by an internal circuit or component to flow from the output terminal, thus precluding the use of a current sensing component in parallel with the output terminals which might draw current from the internal circuit or component that would otherwise flow from the output terminals. For example, the resistance of a circuit component connected between the terminals may be measured by coupling a specific current between the terminals and then measuring the voltage between the terminals. If current from a circuit supplying current to the terminals is diverted to a current sensing component coupled between the terminals, the resistance measurement may be in error.

It may therefore be important to be able to quickly decouple the external input or output terminals of an electrical device in a manner that does not draw current from or change the voltage between the input or output terminals.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect of the present invention, a protection system for an electronic device can include a current limiting device and a solid state relay coupled in series between an input or output terminal and the electronic device. The solid state relay may include an opto-transistor coupled between the terminal and the electronic device in series with the current limiting device and a light-emitting diode optically coupled to the opto-transistor. The current limiting device may be implemented with one or more enhancement mode field effect transistors. In addition to the solid state relay, an electromechanical relay has a relay switch in series with the current limiting device. A voltage detection circuit detects a voltage applied to the terminal having a magnitude that is greater than a specific value. The detection circuit then immediately causes the solid state relay to close. For example, the voltage detection circuit may apply a voltage to a light-emitting diode used in a solid state relay thereby causing current to flow through the first light-emitting diode. The output of the detection circuit also is applied to a relay coil of the electromechanical relay, causing the electromechanical relay switch to open at a time slightly delayed due to the inherent delay of the electromechanical relay as compared to the solid state relay.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
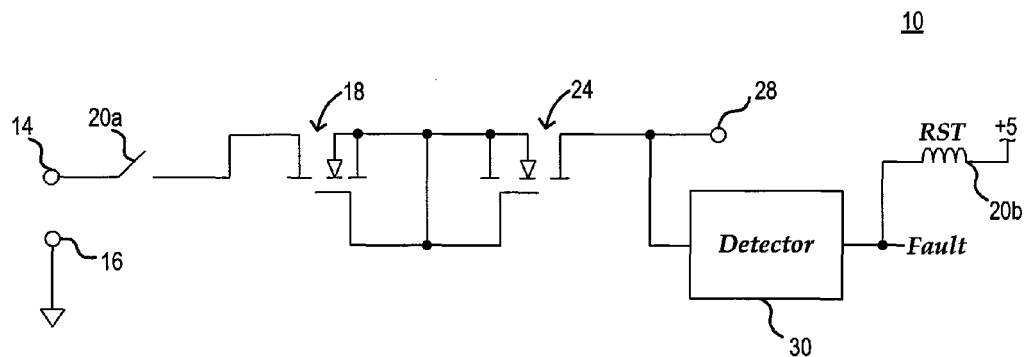
FIG. 1 is a schematic diagram of an embodiment of a prior art electronic device protection circuit.

An embodiment of a prior art protection circuit 10 for an electronic device is shown in FIG. 1. The protection circuit 10 includes a pair of output terminals 14, 16, one of which is coupled to the drain of a first n-channel depletion mode field effect transistor ("FET") 18 through a contact switch 20a of an electromechanical ("EM") relay. A coil that controls the conductive state of the contact switch 20a will be described below. A source of the FET 18 is coupled to a source of a second n-channel depletion mode FET 24. Respective gates of the FETs 18, 24 are both coupled to the sources of the FETs 18, 22. A drain of the FET 24 is coupled to both a terminal 28 that may be coupled to an output terminal of an electronic device (not shown) and a voltage detection circuit 30. The voltage detection circuit 30 detects a voltage that is larger than a predetermined voltage, and then applies a signal to a coil 20b of the EM relay, which results in opening the contact switch 20a. An electronic device coupled to the terminal 28 may then be protected from a voltage that is larger than the specific voltage that may be applied between the terminals 14, 16.

In operation, the FETs 18, 24, being depletion mode FETs, are conductive until the source-to-gate voltage reaches a threshold voltage for the FETs. However, since the respective sources and gates of the FETs 18, 24 are coupled to each other, the FETs 18, 24 never become non-conductive. Instead, the FETs 18, 24 initially act as resistors when the applied voltage is increased so that the current through the FETs 18, 24 increases accordingly. However, when the FET reaches saturation, the current through the FETs 18, 24 remains constant. The FETs 18, 24 thus act as current limiters until the voltage detection circuit 30 resets the EM relay to open the contact switch 20a. In theory, the current limiting effect of the FETs 18, 24 protects an internal circuit or component connected to the terminal 28 until the EM relay contact switch 20a is opened. However, in practice, since the power dissipated by the FETs 18, 24 continues to increase with the applied voltage, the FETs 18, 24 may become damaged or destroyed before the EM relay contact switch 20a can be opened. For example, although the voltage detector 30 may be able to very quickly detect a significant voltage applied to the terminals 14, 16, one EM relay used in the prior art protection circuit 10 may require about 7 ms for the contact switch 20*a* to be opened. The FETs 18, 24 may be damaged or destroyed if the applied voltage switch increases sufficiently during these 7 ms. The prior art protection circuit 10 may be inadequate in many instances.

Figure 2:
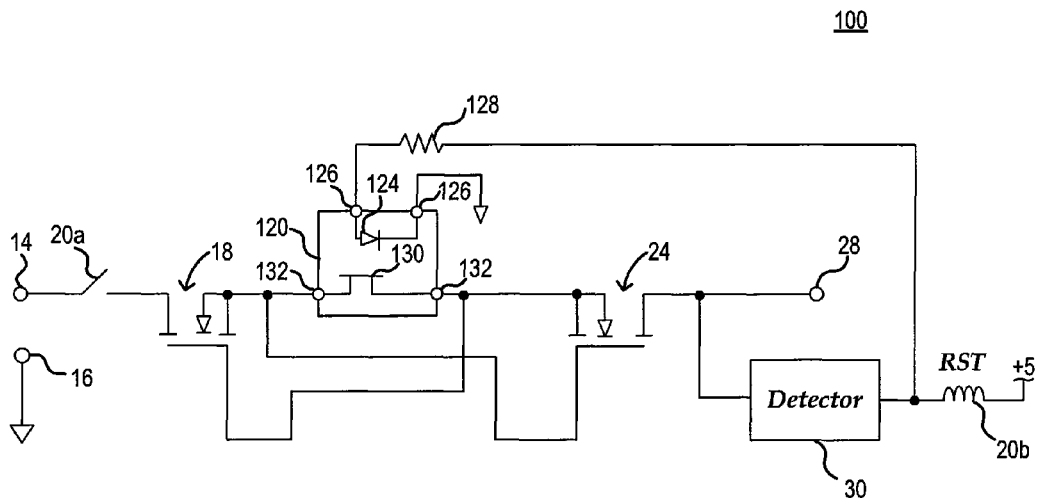
FIG. 2 is a schematic diagram of an electronic device protection circuit according to one embodiment of the invention.

A protection circuit 100 according to one embodiment of the invention is shown in FIG. 2. The protection circuit 100 uses many of the same components that are used in the protection circuit 10 of FIG. 1. Therefore, in the interest of brevity and clarity, the same reference numerals will be used, and an explanation of the function and operation of these components will not be repeated. The protection circuit 100 may differ from the protection circuit 10 by including a solid state relay 120 to interrupt the flow of current through the output terminal 14 before the FETs 18, 24 can become damaged. The solid state relay 120 may include a light-emitting diode ("LED") 124 coupled between a pair of control terminals 126 one of which is coupled to the output of the voltage detection circuit 30 through a resistor 128. The solid state relay 120 may also include a depletion mode n-channel opto-FET 130 that is controlled by light from the LED 124. The opto-FET 130 is coupled between a pair of switch terminals 132, which are coupled to the sources of respective ones of the FETs 18, 24. The solid state relay 120 may have a response time that is significantly faster than the response time of the EM relay having the switch 20*a* and coil 20*b*, and is sufficiently fast to terminate the flow of current through the FETs 18, 24 before the FETs become damaged. However, the magnitude of the voltage that the solid state relay 120 can handle may be less than the magnitude of the voltage that the FETs 18, 24 can handle. For example, in one embodiment, the FETs 18, 24 may have a maximum operating voltage of about 650 volts while the opto-FET 130 may have an operating voltage of only about 60 volts.

In operation, if a relatively high voltage is applied between the terminals 14, 16, the current may initially flow through the FETs 18, 24 and the solid state relay 120 (i.e., between the terminals 132). However, the FETs 18, 24 will then limit the current flow to a level that prevents the voltage drop across the solid state relay 120 from exceeding its maximum operating voltage. The voltage detector 30 will quickly sense the relatively high voltage and will automatically apply a signal to the LED 124. The LED 124 in the solid state relay 120 couples light to the opto-FET 130, which causes it to turn OFF. Significantly, the solid state relay 120 may terminate the flow of current through the FETs 18, 24 before the FETs can be damaged because it may respond much more quickly than the EM relay, which is controlled by the signal though the coil 20*b*. Additionally, the EM relay will respond before an excessive voltage is placed across the solid state relay 120.

Although the detection voltage at which the voltage detector 30 applies a signal to the relay coil 20*b* may be fixed in some embodiments, in other embodiments the detection voltage may be dynamic. More specifically, the voltage detector may be programmed with a detection voltage that varies as a function of variations in the voltage that is applied between the terminals 14, 16 during normal operation so that the detection voltage is always greater than the normal operating voltage.

Figure 3:
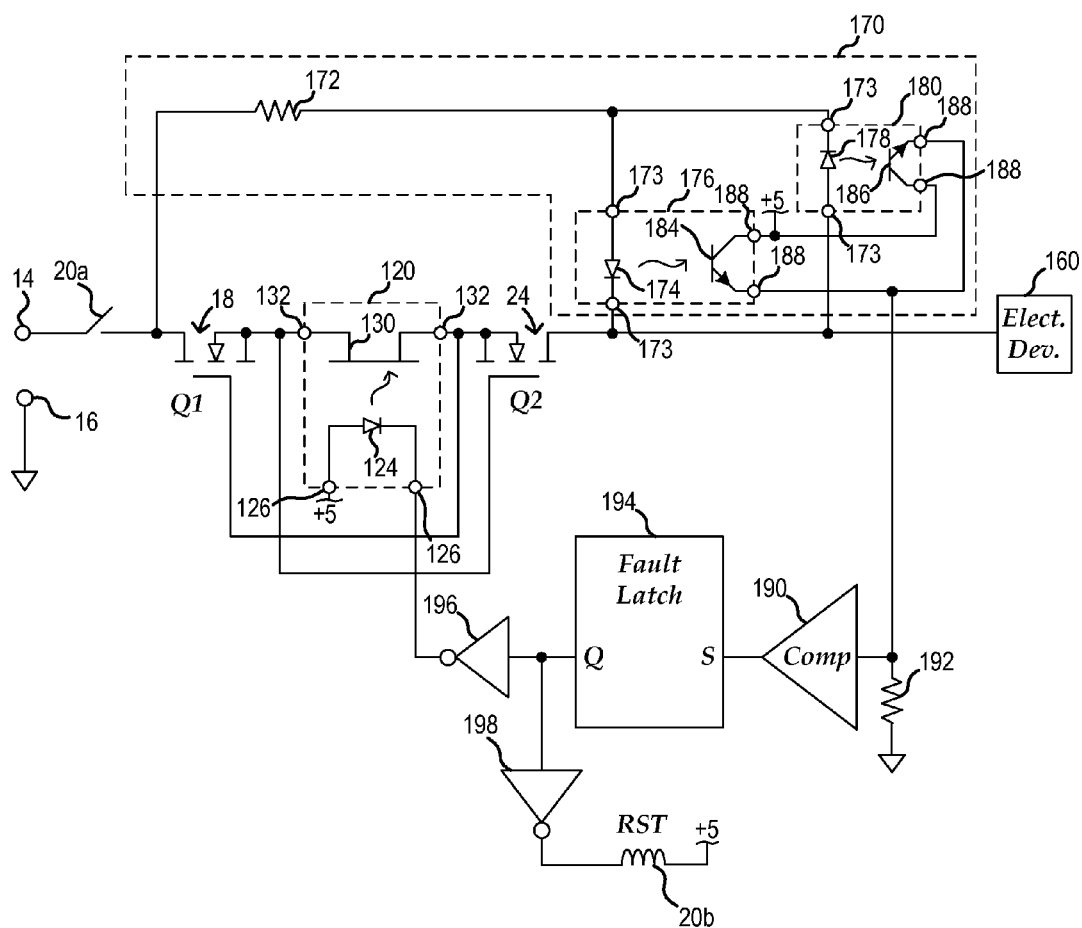
FIG. 3 is a schematic diagram of an electronic device protection circuit according to another embodiment of the invention.

Another embodiment of a protection circuit 150 in accordance with the present invention is shown in FIG. 3. The protection circuit 150 may use many of the same components that are used in the embodiment of the protection circuit 100 shown in FIG. 2. Therefore, in the interest of brevity and clarity, the same reference numerals will again be used, and an explanation of the function and operation of these components will not be repeated. The protection circuit 150 may differ from the protection circuit 100 by avoiding the use of any circuit component that may divert current from the current path between an electronic device 160 to be protected and the terminal 14. The electronic device 160 may be, for example, an electrical testing device that provides a current having a specific magnitude to the terminal 14. The protection circuit 150 includes a voltage detector circuit 170 that includes a resistor 172 coupling the terminal 14 to a second solid state relay 176 and a third solid state relay 180. A control terminal 173 of the second solid state relay 176 is connected to the anode of an LED 174, and the control terminal 173 of the third solid state relay 180 is connected to the cathode of an LED 178. Each solid state relay 176, 180 may include an opto-transistor, such as an opto NPN transistor 184, 186, respectively, that is optically coupled to the respective LED 176, 178. The cathode of the LED 174 and the anode of the LED 178 are connected to respective control terminals 173 of the first and second solid state relays 176, 178, respectively, which are in turn connected back to the conductive path extending between the terminal 14 and the electronic device 160. The respective collectors of the transistors 184, 186 may be coupled through a switch terminal 188 to a supply voltage, such as 5 volts, and the respective emitters of the transistors 184, 186 are coupled through another switch terminal 188 to an input of a comparator 190 and a resistor 192 which is coupled to ground. An output of the comparator 190 is coupled to a set ("S") input of a latch 194 which has an output coupled to an input of a first inverter 196 and an input of a second inverter 198. An output of the second inverter 198 is coupled to the EM relay coil 20*b*, and an output of the first inverter 196 is coupled to the LED 124 of the solid state relay 120.

In operation, if a relatively high voltage is applied between the terminals 14, 16, the current may initially flow through the FETs 18, 24 and the solid state relay 120. However, the FETs 18, 24 will then limit the current flow to a level that prevents the voltage drop across the solid state relay 120 from exceeding its maximum operating voltage. Depending on the polarity of the applied voltage, one of the LED's 174, 178 in the solid state relays 176, 180, respectively, will be conductive to turn ON its respective transistor 184, 186 when the current through the LED reaches a specific level. The magnitude of the voltage applied to the terminals 14, 16 at which the transistors 184, 186 turn ON may be set by the selection of the value of the resistor 172. Thus, when the applied voltage reaches a predetermined specific level, the latch 194 will be set by the comparator 190 to drive the output of the inverter 196 low and cause current to flow through the LED 124 in the solid state relay 120. At the same time, a low at the output of the inverter 198 may reset the EM relay via the coil 20*b* to open the EM relay contact switch 20*a* after the inherent delay of the EM relay. The current flowing through the LED 124 will then illuminate the LED, thereby turning OFF the LED 124 in the solid state relay 120. Significantly, the solid state relay 120 may terminate the flow of current through the FETs 18, 24 before the FETs can be damaged because it can respond much more quickly than the EM relay. Additionally, the EM relay will respond before an excessive voltage is placed across the solid state relay 120. It should be noted that any current flowing through the resistor 172 and one of the LEDs 174, 176 is returned to the current path between the terminal 14 and the electronic device 160 so that the detection circuit 170 does not divert current flowing from the electronic device 160 to the terminal 14 or vice versa.

Although the present invention has been described with reference to the disclosed embodiments, persons skilled in the art will recognize that changes may be made in form and detail without departing from the invention. For example, although the terminal 14 has been described in various places as an output terminal, it may alternatively be in other embodiments an input terminal or an input/output terminal. Such modifications are well within the skill of those ordinarily skilled in the art. Accordingly, the invention is not limited except as by the appended claims.

I claim:

1. A protection circuit, comprising:
   a first terminal;
   a second terminal;
   a current limiting device coupled to the first terminal;
   a solid state relay having switch terminals coupled in series with the current limiting device between the first terminal and the second terminal, the solid state relay having a control terminal and being configured to selectively decouple the first and second switch terminals from each other responsive to a control signal applied to the control terminal;
   a detection circuit coupled to the solid state relay and the first terminal and being configured to detect a voltage applied to the first terminal having a magnitude that is greater than a specific value, the detection circuit being configured to apply the control signal to the solid state relay responsive to detecting the voltage having a magnitude greater than the specific value; and
   an electromechanical relay having a relay contact switch coupled in series with the solid state relay between the first and second terminals, the electromechanical relay having a relay coil coupled to the detection circuit, the electromechanical relay being configured to automatically open the relay contact switch in response to the detection circuit detecting the voltage having a magnitude greater than the specific value.

2. The protection circuit of claim 1 wherein the current limiting device comprises at least one depletion mode field effect transistor.

3. The protection circuit of claim 2 wherein the current limiting device comprises:
   a first depletion mode field effect transistor having a drain coupled to the first terminal, a source coupled to the solid state relay, and a gate; and
   a second depletion mode field effect transistor having a drain coupled to the second terminal, a source coupled to the solid state relay and to the gate of the first depletion mode field effect transistor, and a gate coupled to the source of the source of the first depletion mode field effect transistor.

4. The protection circuit of claim 1 wherein the solid state relay comprises:
   a light-emitting diode coupled to the control terminal of the solid state relay; and
   an opto-transistor optically coupled to the light-emitting diode, the opto-transistor being coupled between the switch terminals of the solid state relay.

5. The protection circuit of claim 1 wherein the detection circuit comprises a voltage detector coupled to the second terminal and configured to detect a voltage larger than a particular level, the voltage detector being configured to apply the control signal to the solid state relay to decouple the first and second switch terminals from each other responsive to detecting a voltage larger than the particular level.

6. The protection circuit of claim 1 wherein the detection circuit comprises a circuit extending between a first connection to the first terminal and a second connection to the first terminal, the second connection being separated from the first connection by the current limiting device.

7. The protection circuit of claim 6 wherein the solid state relay comprises a first solid state relay, and wherein the detection circuit comprises a second solid state relay having a pair of control terminals coupled between the first connection and the second connection, the second solid state relay further having a switch terminal coupled to the first solid state relay and configured to apply the control signal to the solid state relay responsive to a current flowing between the first connection and the second connection.

8. The protection circuit of claim 7 wherein the second solid state relay comprises:
   a light-emitting diode coupled between the control terminals of the second solid state relay; and
   an opto transistor optically coupled to the light-emitting diode of the second solid state relay and electrically coupled to the control terminal of the first solid state relay.

9. The protection circuit of claim 1 wherein the specific voltage that the detection circuit is configured to detect is dynamically adjustable by programming the detection circuit with different voltage detection levels.

10. A protection circuit, comprising:
    a first terminal;
    a second terminal;
    a current limiting device coupled to the first terminal;
    a solid state relay having switch terminals coupled in series with the current limiting device between the first terminal and the second terminal, the solid state relay having a control terminal and being configured to selectively decouple the first and second switch terminals from each other responsive to a control signal applied to the control terminal;
    a detection circuit coupled to the solid state relay and the first terminal and being configured to detect a voltage applied to the first terminal having a magnitude that is greater than a specific value, the detection circuit being configured to apply the control signal to the solid state relay responsive to detecting the voltage having a magnitude greater than the specific value, wherein the detection circuit comprises a circuit extending between a first connection to the first terminal and a second connection to the first terminal, the second connection being separated from the first connection by the current limiting device, and wherein the detection circuit further comprises:
    a first light-emitting diode having a cathode coupled to the first connection and an anode coupled to the second connection;
    a second light-emitting diode having an anode coupled to the first connection and a cathode coupled to the second connection;
    a first opto-transistor optically coupled to the first light-emitting diode, the first opto-transistor being coupled to the control input of the first solid state relay; and
    a second opto-transistor optically coupled to the second light-emitting diode, the second opto-transistor being coupled to the control input of the first solid state relay.

11. The protection circuit of claim 10 wherein the first and second opto-transistors are coupled to the control input of the solid state relay through a circuit, comprising:
    a comparator having an input coupled to the first and second opto-transistors and an output; and a latch having a latch input coupled to the output of the comparator and a latch output coupled to the control input of the solid state relay.

12. A system, comprising:
an electronic device having a device terminal;
a system terminal;
a current limiting device coupling the system terminal to the device terminal;
a solid state relay having a first opto-transistor coupled between the system terminal and the device terminal in series with the current limiting device and a first light-emitting diode optically coupled to the first opto-transistor;
a detection circuit configured to detect a voltage applied to the system terminal having a magnitude that is greater than a specific value, the detection circuit being coupled to apply a voltage to the first light-emitting diode to cause current to flow through the first light-emitting diode responsive to detecting a voltage applied to the system terminal having a magnitude that is greater than a specific value; and
an electromechanical relay having a relay contact switch coupled in series with the solid state relay between the first and second terminals and a relay coil coupled to the detection circuit, the electromechanical relay being configured to automatically open the relay contact switch in response to the detection circuit detecting the voltage having a magnitude greater than the specific value.

13. The system of claim 12 wherein the current limiting device comprises:
a first depletion mode field effect transistor having a drain coupled to the system terminal, a source coupled to a first terminal of the opto-transistor, and a gate; and
a second depletion mode field effect transistor having a drain coupled to the device terminal, a source coupled to the gate of the first depletion mode field effect transistor and to a second terminal of the opto-transistor that is different from the first terminal of the opto-transistor, and a gate coupled to the source of the first depletion mode field effect transistor.

14. The system of claim 12 wherein the electronic device comprises an electrical testing device configured to selectively couple a current or voltage to the device terminal having a plurality of different magnitudes, and wherein the detection circuit is configured to be programmable to adjust the specific voltage that the detection circuit is configured to detect as a function of the current or voltage that the electronic device couples to the device terminal.

15. The system of claim 12, further comprising an electromechanical relay having a relay contact switch coupled between the system terminal and the device terminal, the electromechanical relay further having a relay coil coupled to the detection circuit to receive a signal from the detection circuit responsive to detecting the voltage having a magnitude greater than the specific value to open the relay contact switch.

16. A system, comprising:
an electronic device having a device terminal;
a system terminal;
a current limiting device coupling the system terminal to the device terminal;
a first opto-transistor coupled between the system terminal and the device terminal in series with the current limiting device;
a first light-emitting diode optically coupled to the first opto-transistor;
a detection circuit configured to detect a voltage applied to the system terminal having a magnitude that is greater than a specific value, the detection circuit being coupled to apply a voltage to the first light-emitting diode to cause current to flow through the first light-emitting diode responsive to detecting a voltage applied to the system terminal having a magnitude that is greater than a specific value, wherein the detection circuit comprises:
a second light-emitting diode having a cathode coupled to a first connection to the system terminal and having an anode coupled to a second connection to the system terminal, the second connection being separated from the first connection by the current limiting device;
a third light-emitting diode having an anode coupled to the first connection and a cathode coupled to the second connection;
a second opto-transistor optically coupled to the second light-emitting diode, the second opto-transistor being coupled to the first light-emitting diode; and
a third opto-transistor optically coupled to the third light-emitting diode, the third opto-transistor being coupled to the first light-emitting diode.

17. The system of claim 16 wherein the second and third opto-transistors are coupled to the first light-emitting diode through a circuit, comprising:
a comparator having an input coupled to the second and third opto-transistors and an output; and
a latch having a latch input coupled to the output of the comparator and a latch output coupled to the first light-emitting diode.

18. A method of protecting an electronic device from a voltage applied to a terminal, comprising:
coupling the terminal to the electronic device thorough a solid state relay having an opto-transistor;
optically coupling the opto-transistor to a light-emitting diode;
detecting a voltage applied to the terminal having a magnitude that is greater than a specific value;
limiting the flow of current from the terminal and the electronic device; and
in response to detecting the voltage having a magnitude that is greater than a specific value, interrupting an electrical connection between the terminal and the electronic device by causing current to flow though the light-emitting diode and automatically actuating an electromechanical relay contact switch in series with the terminal and the electronic device to open the contact switch.

19. The method of claim 18 wherein the act of detecting the voltage having a magnitude that is greater than a specific value comprises detecting a voltage differential in a path through which the terminal is coupled to the electronic device.

20. The method of claim 18 wherein the act of limiting the flow of current from the terminal and the electronic device comprises coupling the terminal to the electronic device by at least one depletion mode field effect transistor.

* * * * *

UNITED STATES PATENT AND TRADEMARK OFFICE
CERTIFICATE OF CORRECTION

Page 1 of 1

PATENT NO. : 8,582,265 B2
APPLICATION NO. : 12/788025
DATED : November 12, 2013
INVENTOR(S) : W. J. Britz It is certified that error appears in the above-identified patent and that said Letters Patent is hereby corrected as shown below:

In the Claims

| COLUMN | LINE | ERROR |
|---|---|---|
| 8 | 37 | "thorough" should be --through-- |
| (Claim 18, | line 3) | |

Signed and Sealed this
Second Day of September, 2014

Michelle K. Lee
*Deputy Director of the United States Patent and Trademark Office*